(12) United States Patent
Fitzpatrick

(10) Patent No.: US 11,427,731 B2
(45) Date of Patent: Aug. 30, 2022

(54) ADHESIVE SILICON OXYNITRIDE FILM

(71) Applicant: MICRALYNE INC., Edmonton (CA)

(72) Inventor: Glen Fitzpatrick, Edmonton (CA)

(73) Assignee: Teledyne Micralyne, Inc., Thousand Oaks, CA (US)

( * ) Notice: Subject to any disclaimer, the term of this patent is extended or adjusted under 35 U.S.C. 154(b) by 198 days.

(21) Appl. No.: 15/934,708

(22) Filed: Mar. 23, 2018

(65) Prior Publication Data
US 2019/0292410 A1 Sep. 26, 2019

(51) Int. Cl.
| C09J 1/00 | (2006.01) |
| G02B 1/14 | (2015.01) |
| C01B 21/082 | (2006.01) |
| C23C 16/50 | (2006.01) |
| C23C 16/30 | (2006.01) |
| B81B 3/00 | (2006.01) |

(52) U.S. Cl.
CPC ............ *C09J 1/00* (2013.01); *C01B 21/0823* (2013.01); *C23C 16/308* (2013.01); *C23C 16/50* (2013.01); *G02B 1/14* (2015.01); *B81B 3/0089* (2013.01); *B81B 2201/0214* (2013.01); *B81B 2203/04* (2013.01)

(58) Field of Classification Search
None
See application file for complete search history.

(56) References Cited

U.S. PATENT DOCUMENTS

| 4,363,868 A | 12/1982 | Takasaki et al. |
| 5,497,445 A * | 3/1996 | Imoto .................... G02B 1/045 385/132 |
| 5,861,341 A | 1/1999 | Wen et al. |
| 5,928,732 A * | 7/1999 | Law ................... C23C 16/308 427/579 |
| 6,013,582 A * | 1/2000 | Ionov ............... H01L 21/32139 438/738 |

(Continued)

FOREIGN PATENT DOCUMENTS

| CN | 101159199 | 4/2008 |
| WO | 2015017743 | 2/2015 |

OTHER PUBLICATIONS

Takwale et al.; Characterization of Silicon Oxynitride Thin Films Deposited by Electron Beam Physical Vapor Deposition Technique; Materials Letters; 4170-4175; 2003.*

(Continued)

*Primary Examiner* — Stefanie J Cohen
(74) *Attorney, Agent, or Firm* — Kirsten M. Oates; Rodman & Rodman LLP

(57) ABSTRACT

The invention relates generally to use of a silicon oxynitride film which exhibits desirable physical and chemical properties; superiority in adhesion to metals including noble metals and other metals, transparent conductive oxides, and semiconductor materials compared to silicon dioxide and silicon nitride; is wet-etchable, dry-etchable, or both; and operates as a high-performance overcoat barrier dielectric. The silicon oxynitride film meets performance requirements via a process that does not require an adhesion layer for deposition, and does not contaminate, obscure, or damage the device through incorporation or processing of additional adhesion layers.

3 Claims, 5 Drawing Sheets

(56) References Cited

U.S. PATENT DOCUMENTS

| | | | |
|---|---|---|---|
| 6,174,820 B1 * | 1/2001 | Habermehl | B81C 1/00666 |
| | | | 438/745 |
| 6,326,231 B1 * | 12/2001 | Subramanian | H01L 21/32139 |
| | | | 438/72 |
| 6,727,166 B1 * | 4/2004 | Yeh | H01L 21/28123 |
| | | | 438/592 |
| 7,420,264 B2 | 9/2008 | Goldstein | |
| 7,645,657 B2 | 1/2010 | Brisbin et al. | |
| 8,426,934 B2 | 4/2013 | Lee et al. | |
| 8,619,003 B2 | 12/2013 | Dalriki et al. | |
| 8,658,452 B2 | 2/2014 | El-Gama et al. | |
| 8,703,603 B2 | 4/2014 | Sherrer et al. | |
| 8,829,626 B2 | 9/2014 | Gambino et al. | |
| 8,902,123 B2 | 12/2014 | Dairiki et al. | |
| 8,912,580 B2 | 12/2014 | Milgrew | |
| 8,994,129 B2 | 3/2015 | Cheng | |
| 9,130,012 B2 | 9/2015 | Yamaguchi et al. | |
| 9,156,678 B2 | 10/2015 | Li | |
| 9,196,752 B2 | 11/2015 | Baskaran | |
| 2003/0032292 A1 | 2/2003 | Noguchi | |
| 2004/0113513 A1 * | 6/2004 | Borwick | H02N 1/008 |
| | | | 310/309 |
| 2006/0148262 A1 * | 7/2006 | Lee | G02B 26/001 |
| | | | 438/694 |
| 2006/0214202 A1 | 9/2006 | Zorich et al. | |
| 2010/0215950 A1 * | 8/2010 | Schultz | C03C 17/225 |
| | | | 428/336 |
| 2010/0237446 A1 | 9/2010 | Friedhoff | |
| 2010/0328840 A1 * | 12/2010 | Yamazaki | H01G 5/16 |
| | | | 216/6 |
| 2011/0212593 A1 | 9/2011 | Lacey et al. | |
| 2011/0223415 A1 * | 9/2011 | Drescher | H01J 37/3467 |
| | | | 428/336 |
| 2013/0260503 A1 | 10/2013 | Butter et al. | |
| 2013/0334533 A1 * | 12/2013 | Yamazaki | H01L 29/7869 |
| | | | 257/57 |
| 2014/0353572 A1 | 12/2014 | Takaishi et al. | |
| 2015/0187903 A1 * | 7/2015 | Niimi | H01L 21/31053 |
| | | | 257/401 |
| 2017/0059753 A1 * | 3/2017 | Wagner | C03C 17/3642 |
| 2017/0248536 A1 * | 8/2017 | Chen | G01N 27/223 |

OTHER PUBLICATIONS

Definition adhere: Merriam-Webster; Jun. 8, 2020.*

Habermeh et al. "Properties of low residual stress silicon oxynitrides used as a sacrificial layer," published Jan. 4, 2000, Materials Research Society, Boston, MA (US), Nov. 29, 1999-Dec. 3, 1999.

* cited by examiner

ADHESIVE SILICON OXYNITRIDE FILM

FIELD OF THE INVENTION

The present invention relates generally to use of silicon oxynitride as an adhesive film for forming micro-electromechanical and microfabricated devices.

BACKGROUND OF THE INVENTION

Micro-electromechanical systems ("MEMs") refer to process technologies used to create integrated devices or systems which combine mechanical and electrical components. They are typically fabricated using integrated circuit processing techniques and can range in size from a few micrometers to millimeters. Examples of MEMs include actuators, sensors, 3D mechanical structures, and many other products for use in the communication, energy, transportation, and life sciences industries.

MEMs are used in biological and chemical analysis applications, serving as microscale analogies of standard laboratory test tubes and electrical contacts. While the electronics are fabricated using computer chip integrated circuit technology, the micromechanical components of MEMs are fabricated by manipulations of silicon and other substrates using micromachining processes for selective removal of portions of the silicon or addition of structural layers to form the mechanical and electromechanical components. In this manner, sophisticated biomedical and chemical sensor MEMs have been fabricated using specialized integrated electrodes; however, at the size scale that these features can reach, there are surface effects and interactions that have no analogy in the macro world. Physical and chemical effects can take place that are far outside of the intended reactions. Processing artifacts and surface energy considerations of the MEMS device itself can overwhelm the intended sensor mechanisms.

Typical MEMs use inert dielectrics as protective barrier and isolation materials for gold, platinum and other noble metal electrode arrays which are used for example, in making chemical or biomedical sensor chips, or as encapsulation over conductive or resistive metal/semi metal traces. The metal electrodes must be exposed by removing the dielectric at specific locations for various purposes including, for example, usage of the sensor and connection of the electrode further to the packaging and control circuitry.

Typical dielectrics include, but are not limited to, organic polymer compounds, silicon dioxide, and silicon nitride. Organic polymer compounds adhere well to the electrode material, but are too delicate for further processing, and potentially interact with subsequent biological sample tests. Silicon dioxide exhibits poor adhesion to metals without using adhesion layers, but can be etched using liquid ("wet") chemical etchants which can expose the electrode opening down to the adhesion layer. Silicon nitride protective barriers are mechanically hard, are good barriers, and have a high dielectric strength, but present challenges in order to expose the electrodes. Depending on the application, silicon nitride protective barriers may also require an adhesion layer between the dielectric and the metal electrode. Silicon nitride has no practical liquid etchant patterning mechanisms without hardmasks for hot phosphoric acid etches, and usually requires a high-energy plasma treatment to expose the electrodes. The plasma disturbs the electrode material, sputters electrode material on the sides of the electrode opening, and leaves interfering etch byproduct residues on all surfaces. The vigorous cleaning required to remove such residues can further damage and contaminate the electrode/dielectric structure. These issues have led to serious problems in reliably producing sensor chips that meet the required specifications of pristine cleanliness of the sensor electrode system. If an adhesion layer for silicon dioxide or silicon nitride is used, the added steps to incorporate the adhesion layer in the process flow add complexity. If the electrode is used as a chemical sensor, the presence of even a several atomic layer thick film of a typical adhesion layer material (usually a metal which can form oxides) will introduce a different additional work function to the electrode system, thereby creating interference with the intended analytical reactions.

Attempts have been made to develop an alternative protective barrier which has the required chemical properties and can be used as a high-performance inert dielectric material for biomedical sensor chips or encasing conductive electrodes without requiring an adhesion layer.

Oxynitrides have been used predominantly for the development of tunable optical index of refraction thin films or as transistor insulators (Liao et al., 2009; Brinkmann et al., 2013; Choo et al., 2009; Cavallari et al., 2010). In particular, silicon oxynitride has been used as a coating on transparent substrates such as plastic and glass for glazing; as a layer sandwiched between other layers (e.g., as a capping layer, etch stop layer, spacer barrier layer, liner, dielectric layer) in semiconductor structures; as an insulating film in semiconductor devices such as transistors; as a sacrificial material or layer to be etched in manufacturing semiconductor devices; and as an anti-reflective coating over a metal layer. However, use of silicon oxynitride in MEMS has been limited to a few articles focusing mainly on film stress (Chen et al., 2010).

Accordingly, there is a need in the art for an improved protective barrier which exhibits desired physical and chemical properties for potential use as a high-performance dielectric for MEMs and microfluidic devices.

SUMMARY OF THE INVENTION

The present invention relates generally to a silicon oxynitride film and use of the silicon oxynitride film for forming micro-electromechanical and microfabricated devices.

In one aspect, the invention comprises a silicon oxynitride film having a refractive index ranging from about 1.5 to about 2.1, exhibiting adhesion to one or more of a metal, a transparent conductive oxide, and a semiconductor material, and being wet-etchable, dry-etchable, or both; wherein the film is suitable for use in forming a micro-electromechanical device or a microfabricated device. The adhesive quality confers the ability to form openings to the electrode by conducting complete wet etching alone; complete dry etching alone; or a combination of incomplete dry etching followed by complete wet etching to yield clean, vertical sidewalls in the openings to the electrode.

The electrode material may be selected from a metal, transparent conductive oxide, or semiconductor material. In one embodiment, the metal is a noble metal selected from gold, platinum, palladium, or alloys thereof. In one embodiment, the metal is selected from silver, nickel, tungsten, copper, or alloys thereof. In one embodiment, the transparent conductive oxide is selected from indium tin oxide, fluorine-doped tin oxide, or doped zinc oxide. In one embodiment, the semiconductor material is selected from silicon or a compound semiconductor. The metal may or may not form a contact to it.

In one embodiment, the substrate upon which the electrode material is deposited comprises silicon, glass, fused silica, ceramic, or polymer.

In one embodiment, the film is formed by low-pressure chemical vapor deposition, plasma-enhanced chemical vapor deposition, physical vapor deposition, or a combination thereof. In one embodiment, a source of silicon comprises silane or a derivative thereof. In one embodiment, a gaseous species comprises one or more of a nitrogen-source gas, oxygen, an oxygen-source gas, one or more carrier gases, and a carbon-source gas.

In another aspect, the invention comprises use of the above silicon oxynitride film in forming a micro-electromechanical device or a microfabricated device.

In one embodiment, the silicon oxynitride film is positioned between a noble metal and either a dielectric material or a passivating material.

In one embodiment, the silicon oxynitride film is positioned between two or more metals for electrically isolating the two or more metals.

In one embodiment, the silicon oxynitride film is positioned between one or more metals and one or more semiconductor materials for electrically isolating the metals and materials.

In one embodiment, the silicon oxynitride film is positioned between two or more semiconductor materials for electrically isolating the semiconductor materials.

In one embodiment, the silicon oxynitride film forms a base layer upon which a metallic seed layer is deposited for electrolytic or non-electrolytic plating.

In one embodiment, the silicon oxynitride film adheres to a surface of an optical component. In one embodiment, the optical component comprises a mirror.

In one embodiment, the silicon oxynitride film protects a biochemical agent of interest from exposure to more than one metal on a single electrode.

Additional aspects and advantages of the present invention will be apparent in view of the description, which follows. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will now be described by way of an exemplary embodiment with reference to the accompanying simplified, diagrammatic, not-to-scale drawings. In the drawings.

DETAILED DESCRIPTION OF PREFERRED EMBODIMENTS

Figure 1:
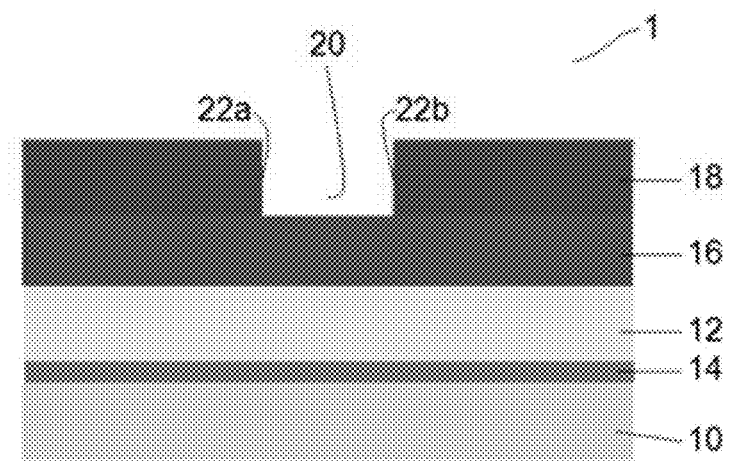
FIG. 1 shows a cross-sectional view of a device in MEMS fabrication following photolithographic masking.

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a," "an," and "the" include plural referents unless the context clearly dictates otherwise.

The present invention relates to use of silicon oxynitride as a film for forming micro-electromechanical and microfabricated devices. As a composite of silicon nitride and silicon oxide, silicon oxynitride offers a compromise of desirable physical and chemical properties to meet performance requirements via a process that does not contaminate or damage micro-electromechanical and microfabricated devices.

As used herein, the term "silicon oxynitride" refers to a material with the chemical formula $SiO_xN_y$. The term is meant to include a material with the chemical formula $SiO_xN_yH_z$. In one embodiment, "x" is greater than zero and less than 2. In one embodiment, "y" is greater than zero and less than 4/3. In one embodiment, "z" is equal to or greater than zero and less than 1. Trace amounts of other additives and materials may be included by doping in the low-pressure chemical vapor deposition (LPCVD) gas or plasma-enhanced chemical vapor deposition (PECVD) gas, evaporant, or sputter target. In one embodiment, hydrogen is present in the silicon oxynitride film resulting from use of silane as a source of silicon in PECVD.

Silicon oxynitride is prepared in the form of a film applied to a suitable electrode material using any conventional deposition method including, but not limited to, LPCVD; PECVD; physical vapor deposition (PVD) including sputtering, evaporation, and the like; or a combination thereof.

In one embodiment, the silicon oxynitride film is prepared using LPCVD or PECVD. LPVCD and PECVD are commonly known to those skilled in the art and will not be discussed in detail. Briefly, LPCVD typically includes a quartz tube placed in a spiral heater which starts with a tube pressure at a very low pressure around 0.1 Pa. The tube is then heated to the desired temperature and a working gas is introduced into the tube at a pressure predetermined between 10-1000 Pa. This working gas consists of dilution gas and a reactive gas that reacts with the substrate and creates a solid phase material on the substrate. After the working gas enters the tube, it spreads out around the hot substrates that are already in the tube at the same temperature. The substrate temperature influences what reactions take place. This working gas reacts with the substrates and forms the solid phase material and the excess material is pumped out of the tube.

Briefly, PECVD typically includes two electrodes in a parallel-plate configuration, plasma gas, and reactive gas in a deposition chamber. A wafer is placed an the bottom electrode and reactive gas with the deposition elements is introduced into the chamber. Reactive gas is then introduced into the chamber between the two electrodes, and voltage is applied to ignite the plasma. The excited-state plasma then dissociates the reactive gas, depositing the desired element or compound onto the wafer. In one embodiment, the silicon oxynitride film is prepared using PECVD. PECVD may be conducted at a lower temperature compared to the higher temperature required for LPCVD. In one embodiment, PECVD is conducted at a temperature ranging from about 100 degrees Celsius to about 350 degrees Celsius. In comparison, LPCVD is conducted at a temperature ranging from about 550 degrees Celsius to about 650 degrees Celsius. Such higher LPCVD temperatures may be unsuitable for particular electrode materials, causing damage or other undesirable effects.

In one embodiment, silane or a derivative thereof is used as a source of silicon. The gaseous species include, but are not limited to, a nitrogen-source gas (for example, ammonia), oxygen or an oxygen-source gas (for example, nitrous oxide), one or more carrier gases (for example, helium, argon, nitrogen or xenon), and methane as a carbon-source for carbide composition. Such sources are suitable for both LPCVD and PECVD.

Suitable electrode or dielectric materials upon which the silicon oxynitride film may be deposited include, but are not limited to, noble metals including gold, platinum, palladium, or alloys thereof; and other metals including silver, nickel, tungsten, copper, or alloys thereof; transparent conductive oxides such as indium tin oxide, fluorine-doped tin oxide, and doped zinc oxide; and semiconductor materials such as silicon or a compound semiconductor. The metal may or may not form a contact to it.

Non-limiting examples of substrates upon which the electrode material is deposited include silicon, glass, fused silica, ceramic, and polymer. In one embodiment, an adhesion layer is disposed between the electrode material and the substrate for securely adhering the electrode material to the substrate.

The physical and chemical properties of the silicon oxynitride film generated using the above processes can be modified as desired in order to produce a suitable film for the intended micro-electromechanical and microfabricated devices.

As an example, PECVD can be used to alter the resultant stoichiometry. The nitrogen to oxygen ratio can be modified to yield a silicon oxynitride film exhibiting a specific stoichiometry which can be evaluated by the refractive index. As used herein, the term "refractive index" refers to an optical property of the silicon oxynitride film, which also provides information about the stoichiometry, density, and dielectric constant. The refractive index is calculated from the ratio of the speed of light in a vacuum divided by the speed of light in a given medium (i.e., the silicon oxynitride film). In one embodiment, the silicon oxynitride film has a refractive index ranging between about 1.5 to about 2.1. This range reflects a stoichiometry of $SiO_xN_y$ having non-zero x and y values, and a silicon oxynitride film which exhibits adhesive ability.

Significantly, the silicon oxynitride film exhibits superior adhesion to noble metals and other metals (particularly gold platinum, and nickel), transparent conductive oxides, and semiconductor materials. In contrast, silicon dioxide and silicon nitride require an adhesion layer to bond to such materials. The composition of the silicon oxynitride film and deposition method used for its formation can be controlled to preclude the need for such a layer, thereby simplifying processing and providing a method to form electrodes without a secondary metal exposed at the opening to the electrode material. The latter reduces electrode contamination potential and eliminates any electrode effects when in use in an electrochemical application, where even the small area of a metal on top of the electrode exposed at the sidewalls of the etching process which forms the electrode interface can introduce secondary chemical reactions.

The adhesive quality confers the ability to form openings to the electrode by conducting complete wet etching alone; complete dry etching alone; or a combination of incomplete dry etching followed by complete wet etching to yield clean sidewalls in the openings to the electrode. The adhesive quality enables the use of isotropic etchants to form the openings, allowing materials which compositionally resemble silicon nitride to maintain the chemical inertness, and using an etching process which does not require typical plasma-based etching. Plasma etching leaves roughened and etch-process polymer byproduct-contaminated sidewalls, and exposes the electrodes to a harsh bombardment as the etching process completes. The adhesive silicon oxynitride film can withstand a wet chemical etch using standard MEMS processes and masking methods, and the film does not undercut between the material to which it is adhered and the dielectric silicon oxynitride. The ability to use silicon oxynitride as an overcoat dielectric that does not require plasma etching thus confers the combined advantages of processing with silicon dioxide but does not need an adhesion layer, as well as potential benefits of a silicon nitride film, which include hardness, barrier and surface properties.

In the embodiments shown in FIGS. 1 to 5, a device (1) in MEMS fabrication comprises a substrate (10), an electrode (12), an adhesion layer (14) between the substrate (10) and electrode (12), a silicon oxynitride film (16) deposited on the electrode (12), and a photoresist (18) comprising an organic polymer deposited on top of the silicon oxynitride (16). The selective removal of portions of the photoresist (18) and silicon oxynitride film (16) may be performed by techniques known to those skilled in the art including, but not limited to, photolithographic masking and etching (e.g., "wet" chemical etchants, and "dry" reactive-ion etching (RIE) using plasma etchants).

In one embodiment shown in FIG. 1, the device (1) is initially subjected to photolithographic masking, whereby the photoresist (18) is chemically resistant to an etchant to define an opening (20) having vertical sidewalls (22a, 22b) and exposing the silicon oxynitride film (16).

Figure 2:
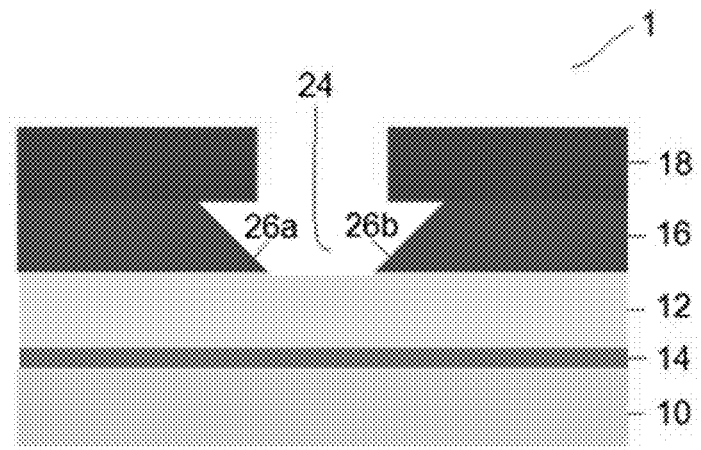
FIG. 2 shows a cross-sectional view of a device in MEMS fabrication, subjected to wet etching isotropically.
Figure 7:
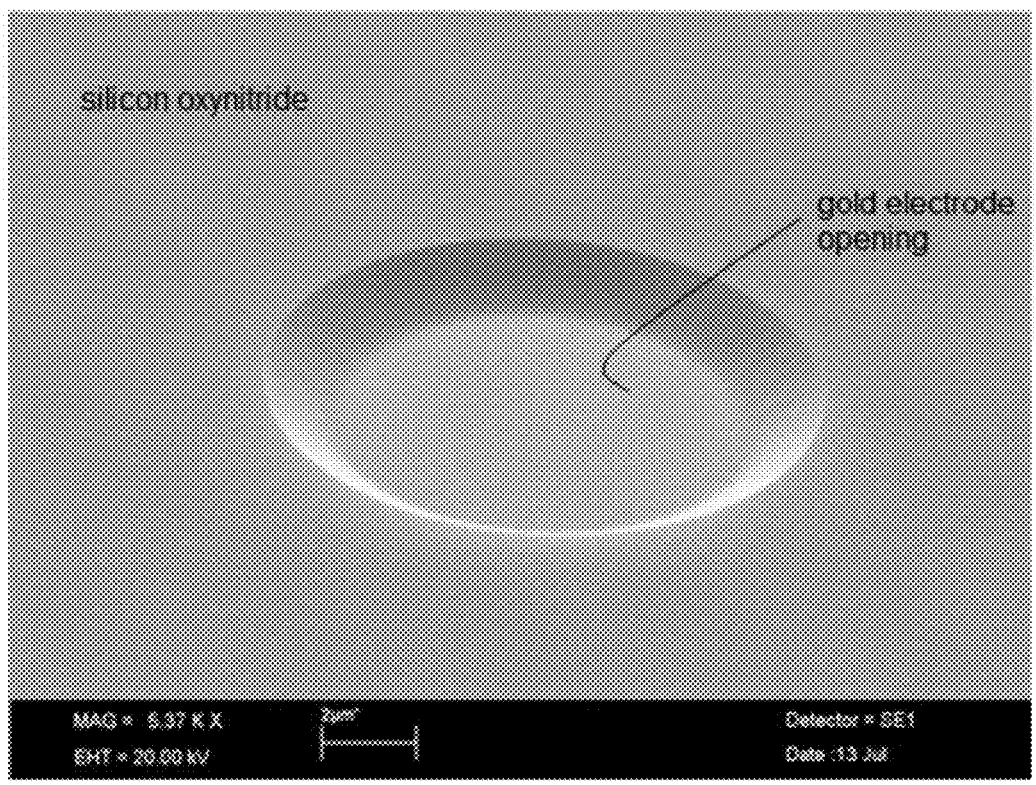
FIG. 7 shows a scanning electron microscope (SEM) image of a wet etched sub-10 μm electrode opening in silicon oxynitride on a planar gold film.

In one embodiment shown in FIGS. 2 and 7, the device (1) is further subjected to wet etching to remove a portion of the silicon oxynitride film (16) through immersion in an isotropic etchant, thereby forming an opening (24) to expose the electrode (12). The opening (24) has sloping sidewalls (26a, 26b) due to the isotropic etchant undercutting the photoresist (18). Suitable isotropic etchants include, but are not limited to, buffered hydrofluoric acid, HNA which comprises a mixture of hydrofluoric acid, nitric acid, and acetic acid, any fluorine-based liquid etchant, and the like.

Figure 3:
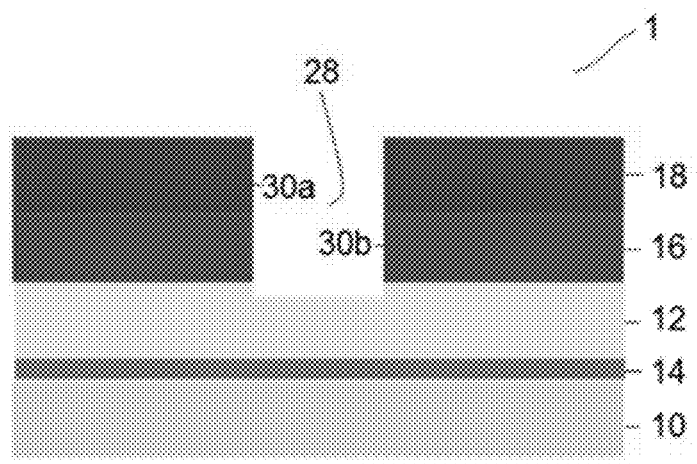
FIG. 3 shows a cross-sectional view of a device in MEMS fabrication, subjected to dry reactive-ion etching (RIE) using plasma etchants anisotropically.

In one embodiment shown in FIG. 3, the device (1) is further subjected to dry reactive-ion etching using plasma etchants to remove a portion of the silicon oxynitride film (16), thereby forming an opening (28) without requiring an adhesion layer between the silicon oxynitride film (16) and electrode (12). However, dry etching may incur damage to the electrode (12) and deposit polymer on the vertical sidewalls (30a, 30b) of the opening (28).

A combination of dry etching and wet etching may alleviate the problems of damage to the electrode (12) and deposited polymer. In one embodiment shown in FIG. 4, the device (1) is further subjected to dry reactive-ion etching using plasma etchants (anisotropically) almost to completion to remove a portion of the silicon oxynitride film (16), thereby forming an opening (32). However, dry etching deposits polymer on the vertical sidewalls (34a, 34b) of the opening (32).

Figure 4:
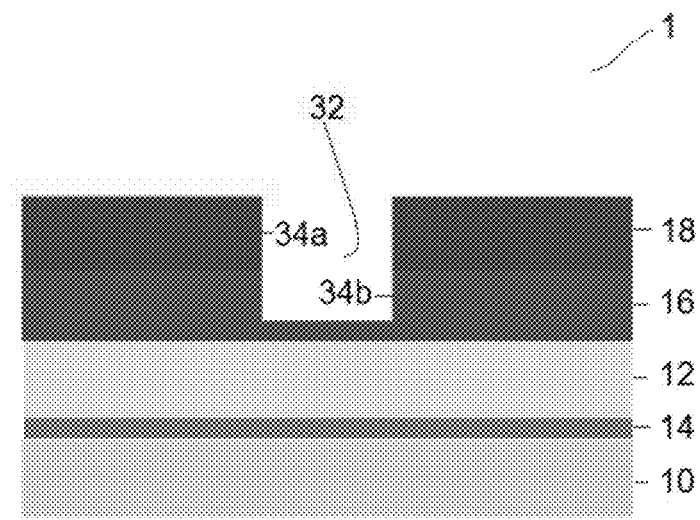
FIG. 4 shows a cross-sectional view of a device in MEMS fabrication, subjected to incomplete, anisotropic dry RIE.
Figure 5:
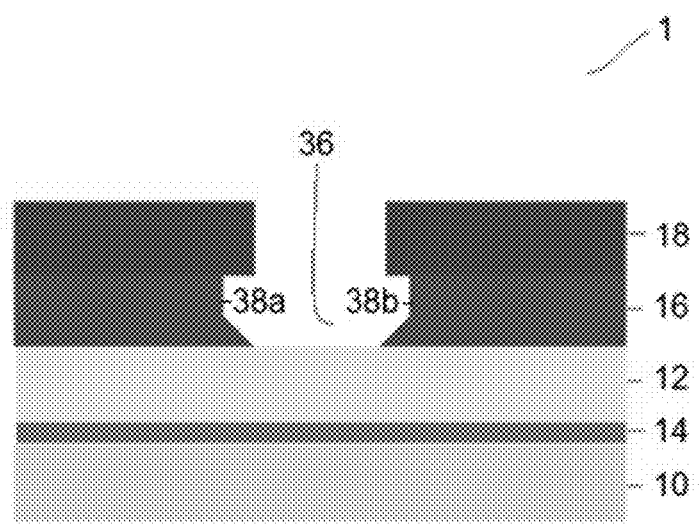
FIG. 5 shows a cross-sectional view of a device in MEMS fabrication, subjected to incomplete, anisotropic dry RIE followed by complete, isotropic wet etching.

In one embodiment shown in FIG. 5, the device (1) of FIG. 4 is further subjected to complete wet etching (isotropically) to expose the electrode (12) without damage, and clean off any polymer deposited on the vertical sidewalls of FIG. 4 (34a, 34b), resulting in the structure shown in FIG. 5 which has clean sidewalls (38a, 38b) of the opening (36).

It is envisaged that the silicon oxynitride film of the present invention may be applied in the formation of many different types of micro-electromechanical and microfabricated devices, including biological and chemical sensors, chemical actuators, microfluidic devices, micro-heaters, and the like.

In one embodiment, the silicon oxynitride film eliminates the need for a metallic adhesion layer between a noble metal or material generally requiring an adhesion layer, and a subsequent dielectric material, or protective or passivating material.

In one embodiment, the silicon oxynitride film is used to provide electrical isolation between two or more metals. In one embodiment, the silicon oxynitride film is used to provide electrical isolation between one or more metals and one or more semiconductor materials. In one embodiment, the silicon oxynitride film is used to provide electrical isolation between two or more semiconductors.

In one embodiment, the silicon oxynitride film is used as a base layer upon which a metallic seed layer is deposited for subsequent electrolytic or non-electrolytic plating, eliminating the requirement for an adhesion layer between the seed layer and the underlying dielectric material.

In one embodiment, the silicon oxynitride film is used as a protective film which is adhered directly to the metallic surface of an optical component (for example, a mirror), eliminating the requirement for a separate intermediary adhesion layer.

In one embodiment, the silicon oxynitride film provides a material with a specified refractive index other than that of silicon, and is adhered directly to the surface of an optical component (for example, lenses or waveguides formed of silicon or other semiconductor material), eliminating the requirement for a separate intermediary adhesion layer.

In one embodiment, the silicon oxynitride film is used in biochemical applications to minimize the risk of exposure of a biochemical agent of interest to more than one metal on a single electrode.

Embodiments of the present invention are described in the following Examples, which are set forth to aid in the understanding of the invention, and should not be construed to limit in any way the scope of the invention as defined in the claims which follow thereafter.

Example 1

Wafers were fabricated using glass as the substrate, gold as the electrode, and a film of either silicon nitride or silicon oxynitride deposited on the electrode. An opening was plasma etched through the silicon nitride film or wet etched through the silicon oxynitride film to expose the electrode. Silicon oxynitride adhesion was tested through extended etch periods where the interface was subjected to longer etch times by a factor of up to 4 times to assess any weaknesses in the film interface to the gold. A production over-etch of 30% was established. The objective was to compare the overall quality of the wafers using the different films, particularly the potential adhesion of the films to the gold electrode.

Figure 6A:
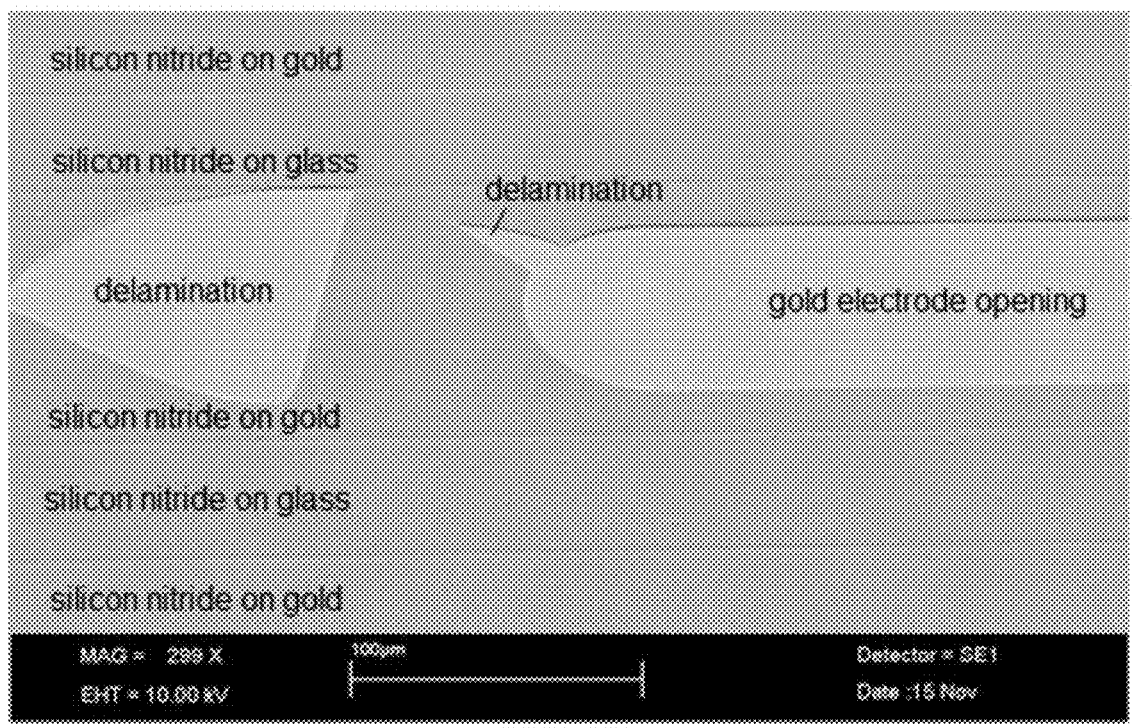
FIG. 6A shows a scanning electron microscope (SEM) image of a device in MEMS fabrication, subjected to high energy plasma etching and exhibiting silicon nitride delamination from the gold electrode.
Figure 6B:
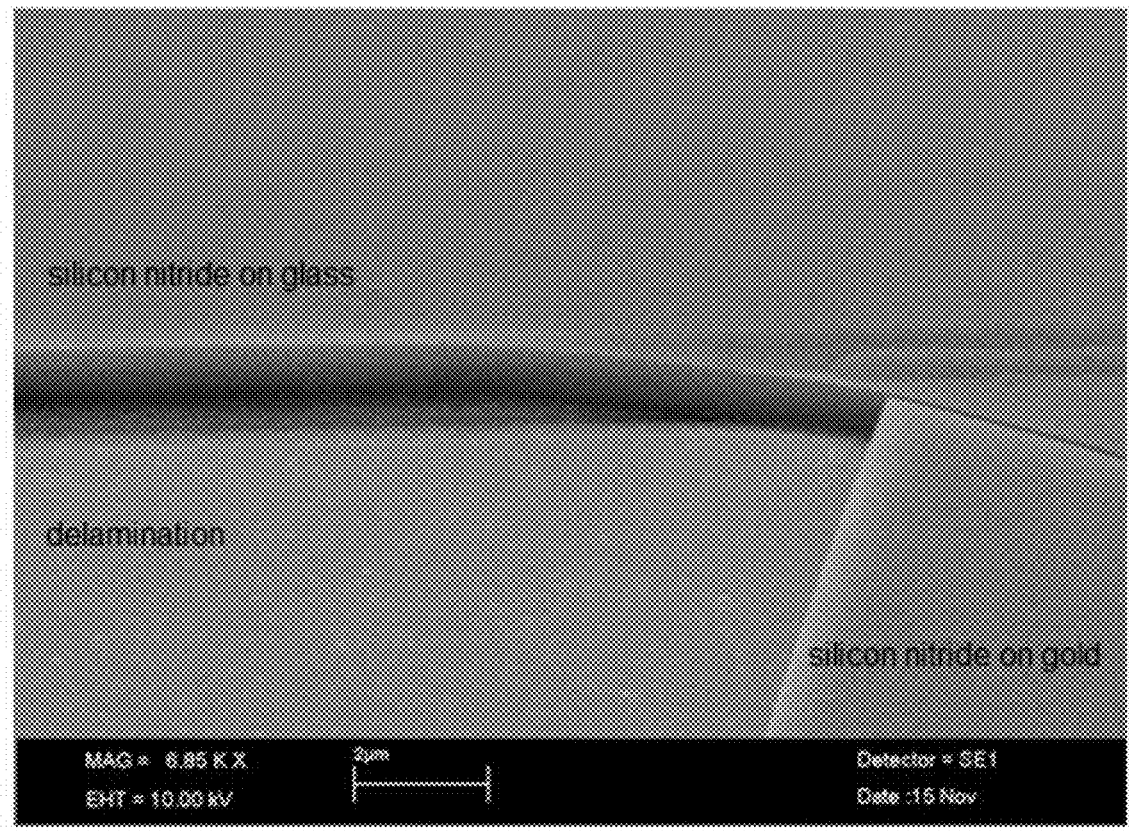
FIG. 6B is an enlarged view of a portion of FIG. 6A, showing an area of delamination of silicon nitride from the gold electrode.
Figure 6C:
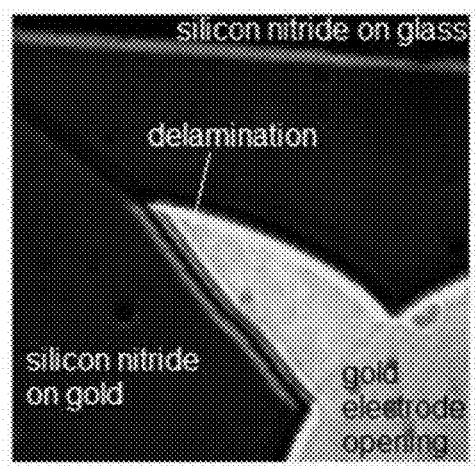
FIG. 6C is an enlarged view of a portion of FIG. 6A, showing an area of delamination of silicon nitride from the gold electrode.
Figure 6D:
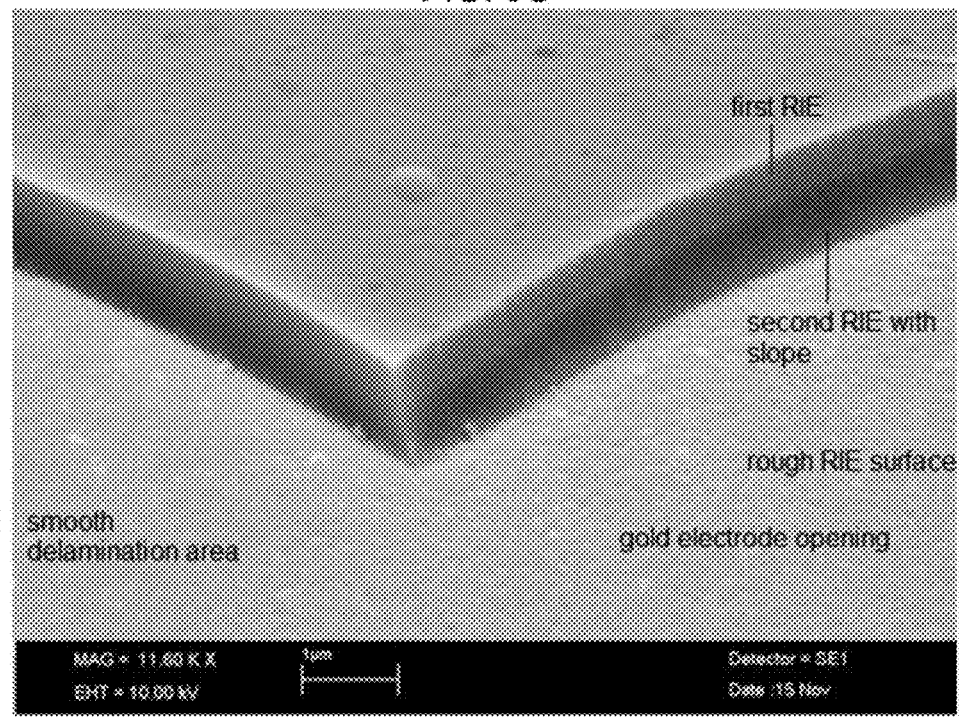
FIG. 6D is an enlarged view of a portion of FIG. 6C, showing the transition between the area of silicon nitride delamination and the gold electrode opening.
Figure 6E:
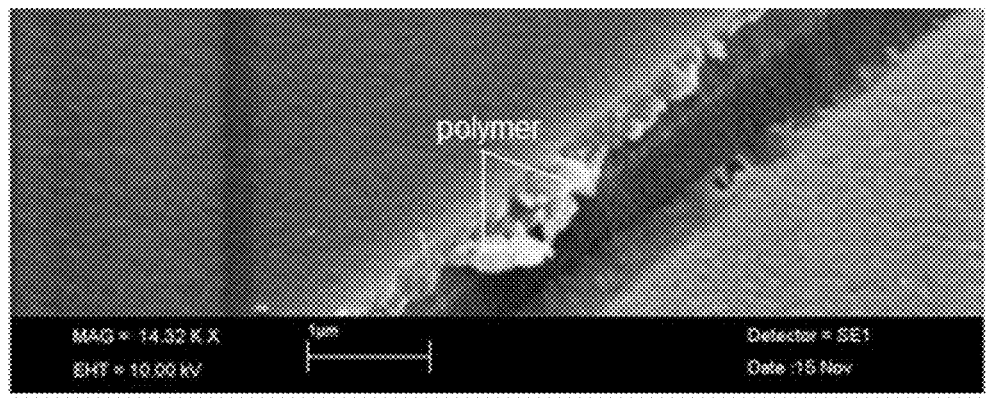
FIG. 6E is an enlarged view of a portion of FIG. 6D, showing the presence of polymer on the first RIE layer.

The silicon nitride film exhibited poor adhesion to the gold electrode, as shown by cracks and areas of delamination in which the silicon nitride film had broken away from the gold electrode (FIGS. 6A-D). Delamination occurred only on the gold electrode, and stopped abruptly at the interface to the glass substrate to which the silicon nitride adhered well (FIGS. 6A-B). FIGS. 6C-D shows the transition between the area of delamination and the opening exposing the gold electrode. The delamination area from which the silicon nitride had broken away was smooth to reveal the undamaged gold electrode, whereas the surface of the exposed gold electrode through the opening was rough, representing damage and harsh bombardment incurred by high-energy plasma etching which was required to expose the gold electrode through the silicon nitride film. A first etch was performed to determine an exact etch rate, followed by a second etch for completion based on etch rate calculations to minimize bombardment from overetching. The final result is shown after a number of cleaning protocols which were designed to be a compromise between cleaning efficacy and reduced exposure of the gold electrode to harsh chemistries, which still left some polymer partially removed and clinging to the sidewall (FIG. 6E). Without being bound to any theory, the polymer is formed as the silicon nitride must be etched in a plasma, and fluorine byproducts form on the surface, and polymer creation can be reduced in process at the expense of etch control. Additional vigorous cleaning in attempt to remove the polymer caused further delamination of the silicon nitride film, rampant undercut due to poor adhesion of the silicon nitride film to the gold electrode, and subjected the exposed electrode to potential erosion and surface contamination.

Seven hundred wafers were coated with silicon oxynitride films and each with more than 2000 gold electrode openings were fabricated, inspected for integrity, and tested for efficacy through visual inspection and chemical tests (data not shown). The wafers formed with silicon oxynitride films exhibited significant improvements in both adhesion and cleanliness compared to the wafers fabricated with silicon nitride films. In addition, damaging high energy plasma etching as required with the silicon nitride film was not needed to form the gold electrode opening through silicon oxynitride film. The silicon oxynitride film could withstand a wet chemical etch without damage or delamination, and the exposed gold electrode was seen to be relatively pristine compared to the silicon nitride based devices as confirmed with electrode potential analysis.

A representative wafer including silicon oxynitride film is shown in FIG. 7. A sub-10 μm opening was wet etched through the silicon oxynitride film deposited on the gold electrode. The surface of the gold electrode exposed by the opening was smooth and undamaged, with smooth sloping side walls lacking polymer contaminant. The silicon oxynitride adhered well to the gold electrode, with no cracks or delamination. The ability to use silicon oxynitride as a film that does not require plasma etching thus confers the combined advantages of processing with silicon dioxide but does not need an adhesion layer, as well as potential benefits of a silicon nitride film, which include hardness, barrier and surface properties.

Example 2

Two PECVD tools were used to deposit silicon oxynitride films on gold electrodes. In the experiments, pressure, temperature, power, dilution gas, and flows of relative gases (e.g., oxygen and nitrogen sources) were determined. The results were characterized with respect to index, deposition rate, etch rate, and adhesion ability. Compositions were determined with identical stoichiometries and index values, but of differing adhesion qualities, leading to adhesion mechanisms beyond simple composition models (data not shown).

It should be apparent, however, to those skilled in the art that many more modifications besides those already described are possible without departing from the inventive concepts herein. The inventive subject matter, therefore, is not to be restricted except in the scope of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A micro-electromechanical device or a microfabricated device comprising:
   (i) a substrate comprising silicon, glass, fused silica, ceramic, or polymer;
   (ii) a metal or a transparent electrically conductive oxide selected from indium tin oxide, fluorine-doped tin oxide, or doped zinc oxide, deposited on the substrate; and
   (iii) a silicon oxynitride film deposited on the metal or the transparent conductive oxide, and having adhesion and wet-etchable properties,
      wherein the silicon oxynitride film is adhesive to the metal or the transparent electrically conductive oxide without requiring an adhesion layer or an intermediate layer; and
      wherein the silicon oxynitride film has an opening formed therethrough by an etchant during wet etching to define and expose an electrode surface, the silicon oxynitride film remaining adhesive to the metal or the transparent electrically conductive oxide during wet etching of the opening, and the opening and the electrode surface being free of damage and contaminants as compared to a film subjected to plasma etching.

2. The micro-electromechanical device or the microfabricated device of claim 1, wherein the substrate comprises glass, and the metal comprises gold.

3. The micro-electromechanical device or the microfabricated device of claim 1, wherein the substrate comprises silicon, and the metal comprises platinum.

* * * * *